(12) United States Patent
Shoudis

(10) Patent No.: US 12,081,217 B2
(45) Date of Patent: Sep. 3, 2024

(54) DYNAMICALLY CORED EXPLOSIVELY PUMPED FLUX COMPRESSION GENERATOR

(71) Applicant: Justin Shoudis, Urbana, IL (US)

(72) Inventor: Justin Shoudis, Urbana, IL (US)

( * ) Notice: Subject to any disclaimer, the term of this patent is extended or adjusted under 35 U.S.C. 154(b) by 228 days.

(21) Appl. No.: 17/663,524

(22) Filed: May 16, 2022

(65) Prior Publication Data

US 2023/0370052 A1 Nov. 16, 2023

(51) Int. Cl.
| | | |
|---|---|---|
| *H03K 3/53* | (2006.01) | |
| *H02K 11/00* | (2016.01) | |
| *H02K 11/049* | (2016.01) | |
| *H02K 21/10* | (2006.01) | |

(52) U.S. Cl.
CPC ........... *H03K 3/53* (2013.01); *H02K 11/0094* (2013.01); *H02K 11/049* (2016.01); *H02K 21/10* (2013.01)

(58) Field of Classification Search
CPC .... H03K 3/53; H02K 11/0094; H02K 11/049; H02K 21/10
See application file for complete search history.

(56) References Cited

U.S. PATENT DOCUMENTS

| | | | | |
|---|---|---|---|---|
| 2,930,826 A | * | 3/1960 | Dingman | H02K 21/225 |
| | | | | 123/149 R |
| 4,200,831 A | * | 4/1980 | Weldon | H02K 55/02 |
| | | | | 376/125 |
| 4,935,708 A | * | 6/1990 | Weldon | H02K 55/02 |
| | | | | 123/3 |
| 2016/0036307 A1 | * | 2/2016 | Morris | H02K 11/20 |
| | | | | 310/90 |

* cited by examiner

*Primary Examiner* — Jue Zhang
(74) *Attorney, Agent, or Firm* — Julie King

(57) ABSTRACT

A helical-type explosively pumped flux compression generator (HEPFCP) capable of natively generating its own electrical current to successfully power the explosive phase of current generation required to power a load. It uses the chemical energy stored in a solid propellant to rotate an explosively laden dynamo armature inside a stationary solenoid winding. Thrust produced by burning propellant is directed by aerodynamic structures so it causes centripetal acceleration of the core thereby inducing an electromotive force in the solenoid winding, causing it to act much as a stator in dynamo. A rectifier rectifies this induced AC voltage into a DC current, then charges a capacitor bank. The propellant burns down to the explosive core, then the core expands, contacting the solenoid winding, forming a new circuit. The compression caused by the continuously expanding core will diminish the number of turns not short circuited, compressing the magnetic field, and creating an inductive current. At the point of greatest flux compression, a load switch is opened, and the maximum current is delivered to the load.

3 Claims, 12 Drawing Sheets

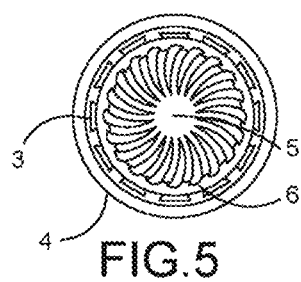
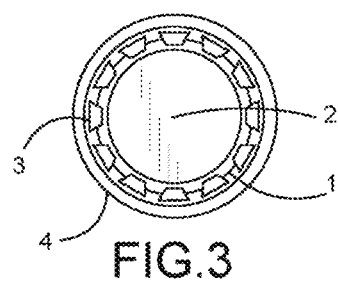
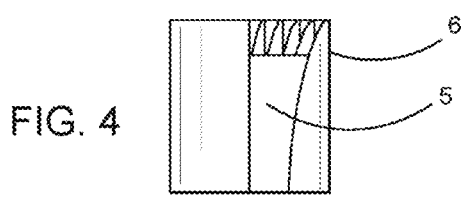
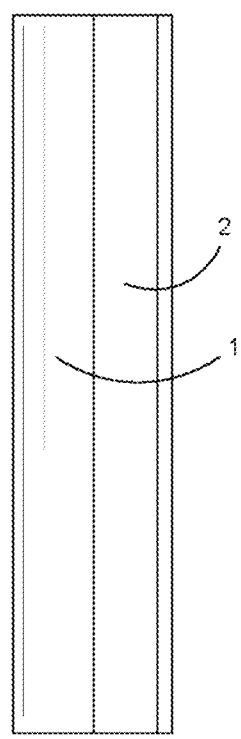
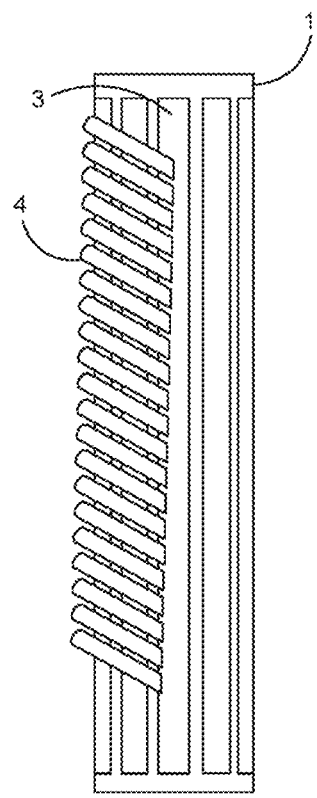

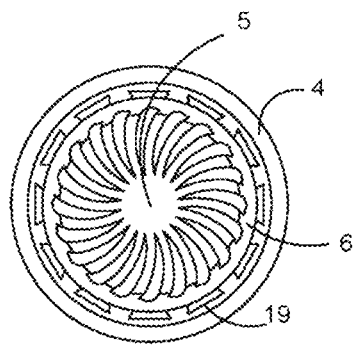
FIG. 17
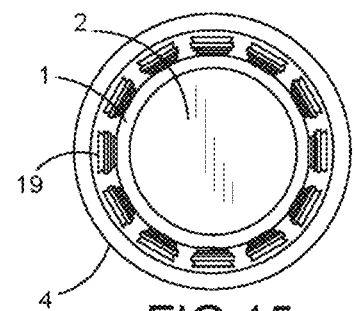
FIG. 15
FIG. 16
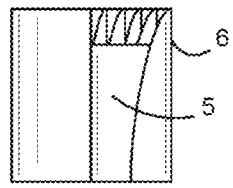
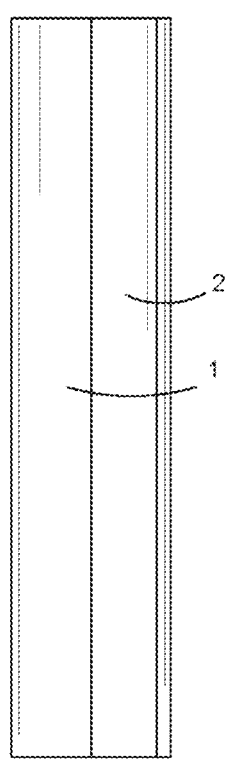
FIG. 13
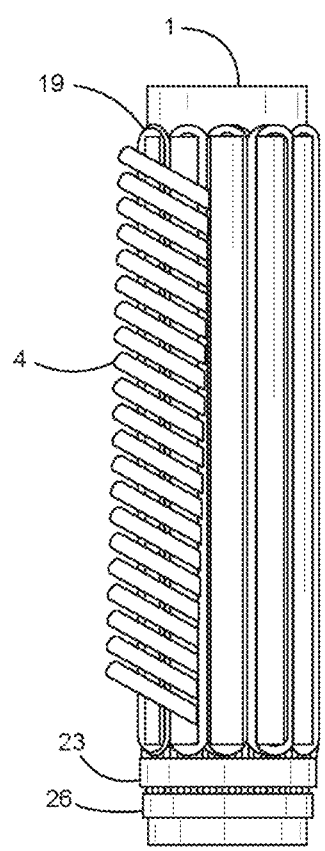
FIG. 14

DYNAMICALLY CORED EXPLOSIVELY PUMPED FLUX COMPRESSION GENERATOR

BACKGROUND OF THE INVENTION

The invention relates generally to explosively pumped flux compression generators (EPFCG) and traditional alternating current producing dynamos (alternator). In particular, the invention combines the some of the core functions of these two devices to allow a flux compression generator to produce the power needed to generate the initial magnetic field without the need for bulky electrical storage devices or a connection to an external power source.

Conventional EPFCGs were first designed in the early 1950s, with some of the earliest generators being successfully tested by 1952 in the Soviet Union. Although more advanced and refined generators would eventually be developed, this invention borrows several key design elements from these more "primitive," early generators, particularly the helical generator developed by Robert Lyudaev. This device uses an explosive laden metallic core surrounded by solenoid winding powered by an external power source (in the original design, it was by a battery of solenoids). Once a suitable current is achieved the core is detonated resulting in a very intense magnetic field.

The building of electrical generators in some form coincides with the earliest studies of electrical phenomenon in our modern world. With the "Dynamo Electric Machine" being issued a patent in 1883 (U.S. Pat. No. 284,110) the world has long been familiar with the device. The basic elements of a generator are well known, a magnetic field producing component is moved relative to a length of electrically conductive material. In the most simple form of an electrical generator, an array of magnets (permanent (field magnet) or a coil of an electromagnet (field winding)) is arranged in cylindrical shape (a rotor) and is rotated within a winding of conductive wire (armature). The rotation of the rotor within the armature produces an electrical current.

Currently, most EPFCGs rely on external power sources for the necessary electrical current needed to generate a magnetic field. However, the basic design of both EPFCGs and of the traditional dynamo share some basic elements that can be combined to from a unique device that can free the EPFCG from current constraints. This new device provides a means to deliver high energy pulses to a load away from traditional electrical infrastructure.

SUMMARY OF THE INVENTION

The invention is a helical-type explosively pumped flux compression generator (HEPFCP) capable of natively generating its own electrical current in an amount required to successfully power the explosive phase of current generation required to power a load.

The invention in any embodiment contains essential components. There is a rotating core, consisting of an explosive contained by an armature casing. That armature casing has either permanent magnets or electromagnets attached to the outside in vertical fashion, such that the entire armature is encircled vertically by either magnets or electromagnets. Solenoid winding covers the magnet-encircled armature in coils extending the entire length of the magnet-encircled armature.

On one end of that armature is a solid flammable accelerant contained by an aerodynamic structure capable of directing the thrust of the accelerant as the accelerant burns, such as a thrust-producing finned cap. A bearing connects the accelerant and its containment structure to the armature core. On the other end of the armature is another bearing that connects the armature to the electronic components of the invention.

The electronic components consist at the minimum of a rectifier (such as diodes, thyristor or semiconductor-controlled rectifier) to change AC voltage to a DC current, a capacitor bank, and a load switch. Finally, there is a load to which the current will be delivered.

The active functions of the invention begin when the solid propellant is ignited. The invention then uses the chemical energy from the burning solid propellant to produce thrust. This thrust is directed by the appropriate aerodynamic structures, such as a finned cap surrounding the propellant, so that a majority of the thrust produced will cause a centripetal acceleration of the magnet- or electromagnet-encircled explosively laden dynamo armature core. That core then rotates inside a stationary solenoid winding.

As that core rotates, it induces an electromotive force in the solenoid winding of the HEPFCP, causing the invention to act much as a stator in dynamo. This induced AC voltage is then rectified into a DC current by the rectifier, which then charges a capacitor bank.

Eventually the propellant will burn down to the explosive core. At that point, the explosive in the core will ignite and begin to expand. The expansion will cause the magnets or electromagnets attached to the outside of the armature of the core to contact the surrounding solenoid winding, forming a new circuit. The compression caused by the continuously expanding core will diminish the number of turns not short circuited, compressing the magnetic field, and creating an inductive current. At the point of greatest flux compression, a load switch is opened, and the maximum current is delivered to the load.

OBJECT OF THE INVENTION

The purpose of this invention is for a device to be able to deliver intense, high-level currents in isolated environments separate from stationary power supplies or generators. This way, certain high-energy devices can be used remotely, without a need for energy infrastructure.

BRIEF DESCRIPTION OF DRAWINGS

FIG. 1 is a cutaway view of the explosive and armature core of the first embodiment.

FIG. 2 is a cutaway view of the solenoid winding and armature part of the core of the first embodiment.

FIG. 3 is a cross-sectional view of the core and solenoid winding of the first embodiment.

FIG. 4 is a cutaway view of a thrust-directing finned cap encasing the accelerant in the first embodiment.

FIG. 5 is a cross-sectional view of a thrust-directing finned cap and accelerant segment of the first embodiment.

FIG. 13 is a cutaway view of the explosive and armature core of the second embodiment.

FIG. 14 is a cutaway view of the solenoid winding and armature part of the core of the second embodiment.

FIG. 15 is a cross-sectional view of the core and solenoid winding of the second embodiment.

FIG. 16 is a cutaway view of a thrust-directing finned cap encasing the accelerant in the second embodiment.

FIG. 17 is a cross-sectional view of a thrust-directing finned cap and accelerant segment of the second embodiment.

DETAILED DESCRIPTION

The device will always require certain elements. Principally, a core that can produce a magnetic field is one requirement. However, this can be achieved in two principal ways: with permanent magnets, or by an electromagnet.

This produces two different embodiments that operate under similar principles but have different requirements. The second embodiment can be altered to produce a third that contains a capacitor bank.

The first embodiment uses permanent magnets.

Figure 6:
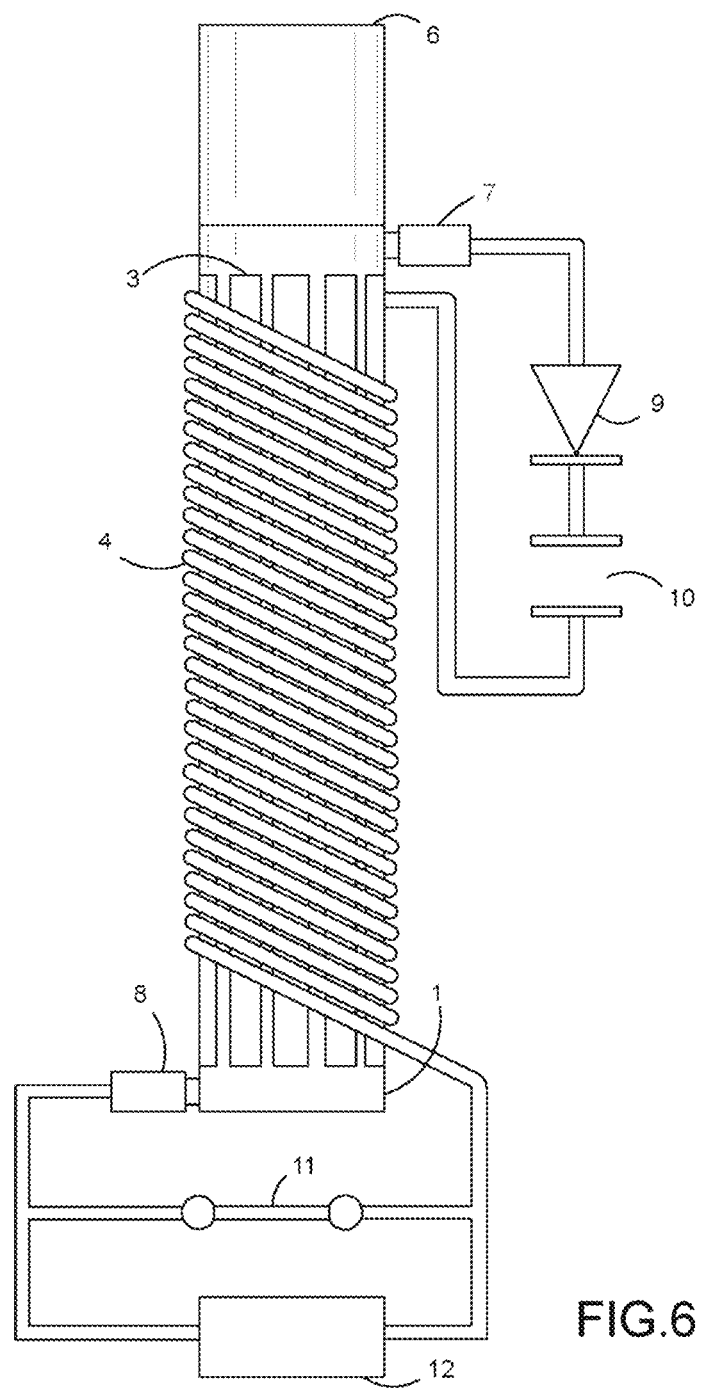
FIG. 6 is a view of the layout of the first embodiment.

The basic components of the first embodiment are shown in FIG. 1, FIG. 2, FIG. 3, FIG. 4, FIG. 5, FIG. 6, FIG. 7, and FIG. 8. The functioning of the embodiment is shown in the diagram that is FIG. 9. There is a rotating core as shown in FIG. 1 with an armature 1 containing an explosive 2. This core is encircled by vertical permanent magnets 3 as shown in FIG. 2. A solenoid winding 4 covers the magnet-encircled armature in coils extending the entire length of the magnet-encircled armature. As FIG. 2 shows a cutaway of the solenoid winding to better show the magnets, the cross-section in FIG. 3 and the layout in FIG. 6 depict how the solenoid winding covers the entire core.

FIG. 4 shows how one end of the armature is a solid flammable accelerant 5 contained by an aerodynamic structure capable of directing the thrust of the accelerant as the accelerant burns 6, such as a thrust-producing finned cap. FIG. 5 shows a cross-section of that end of the armature, showing the solenoid winding 4 surrounding the magnets 3, and instead of showing the explosive core inside the armature, shows the accelerant 5 contained inside the cap 6.

Figure 7:
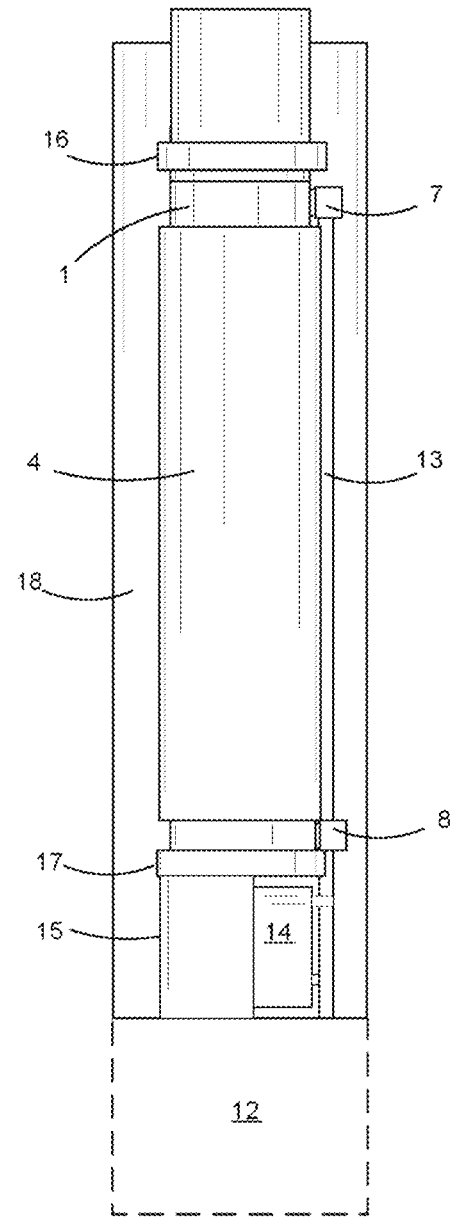
FIG. 7 is a cross-sectional view of the outer housing and some inner components of the first embodiment.

FIG. 6 depicts the overall layout of the first embodiment. Brushes 7, 8 are attached to each end of the core 1. The first brush 7 is also attached to the solenoid winding 4 by electronics consisting at a minimum of a rectifier 9 (such as diodes, thyristor or semiconductor-controlled rectifier) to change AC voltage to a DC current, and a capacitor bank 10. The second brush 8 is also attached to the solenoid winding by electronics consisting at a minimum of a load switch 11 and load to which the current will be delivered 12. As shown in FIG. 7, the brushes are connected by necessary structures and wiring for the functioning of the brushes 13, and the electronics 14 are in a housing 15 at the bottom end of the core.

As shown in FIG. 7, on one end of the armature, a bearing 16 connects the accelerant and its containment structure 6 to the top of the armature core 1. On the other end of the armature is another bearing 17 that connects the armature to the electronic components of the invention 14, in their housing 15. All components are then encased in a non-conductive housing 18, with the load 12 at the end next to the electronics housing 15.

Figure 8:
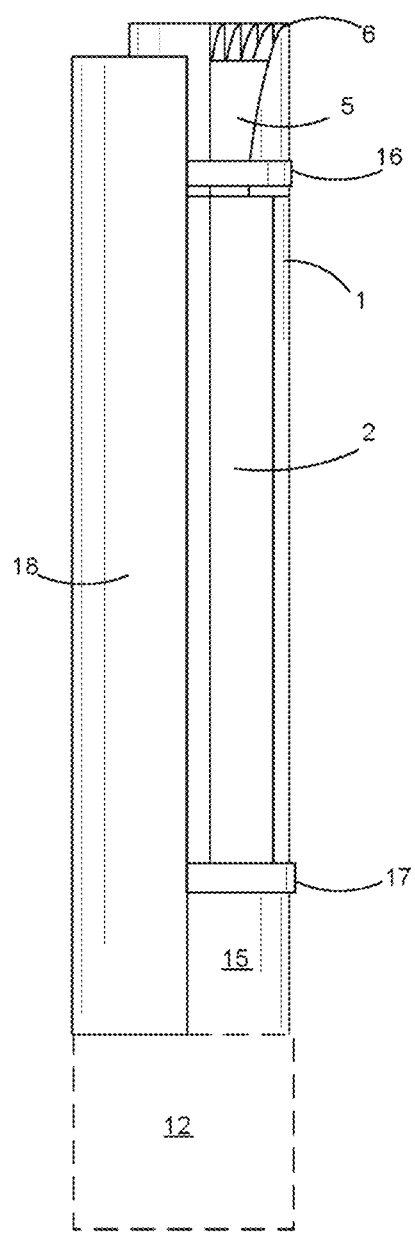
FIG. 8 is a cross-sectional view of the outer housing and additional inner components of the first embodiment.
Figure 9:
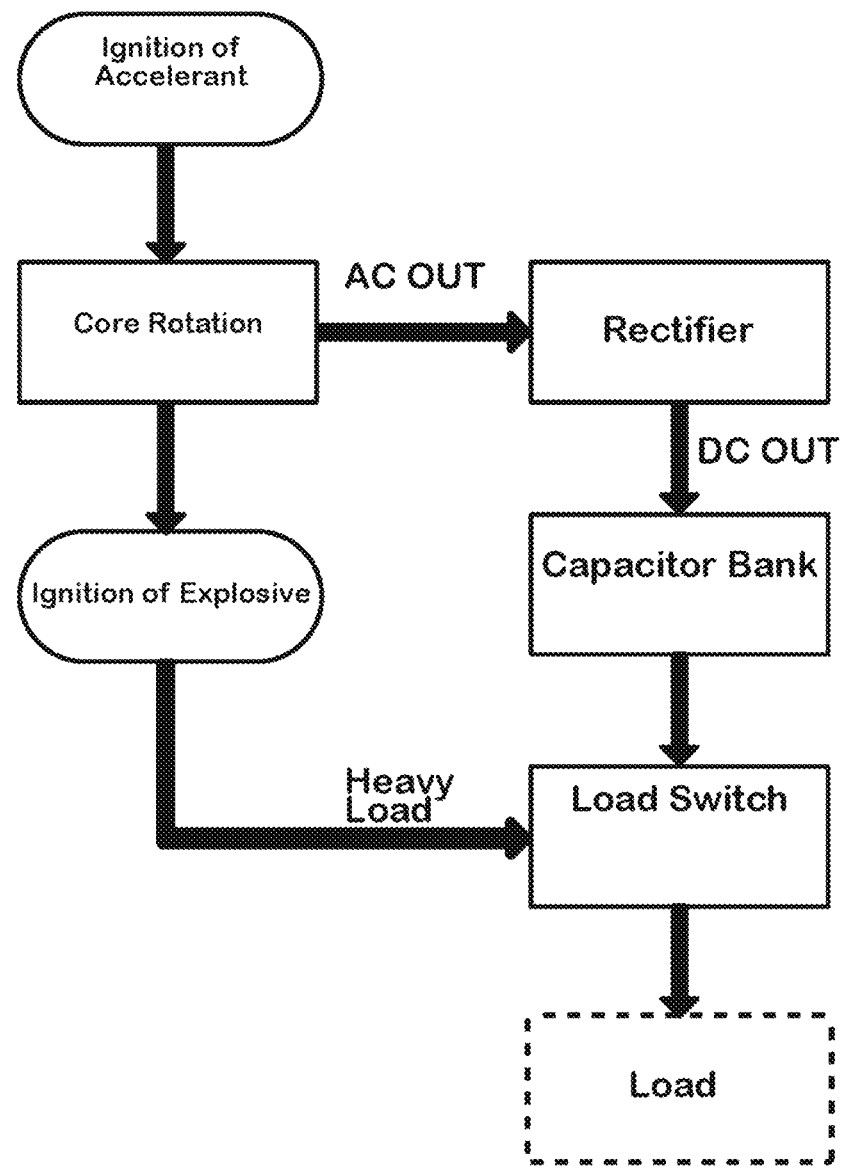
FIG. 9 is a diagram of the operation of the first embodiment.

FIG. 8 depicts another view of the first embodiment showing how the non-conductive housings 15, 18 cover the inner components and how the finned cap 6 covers the accelerant 5.

Figure 10:
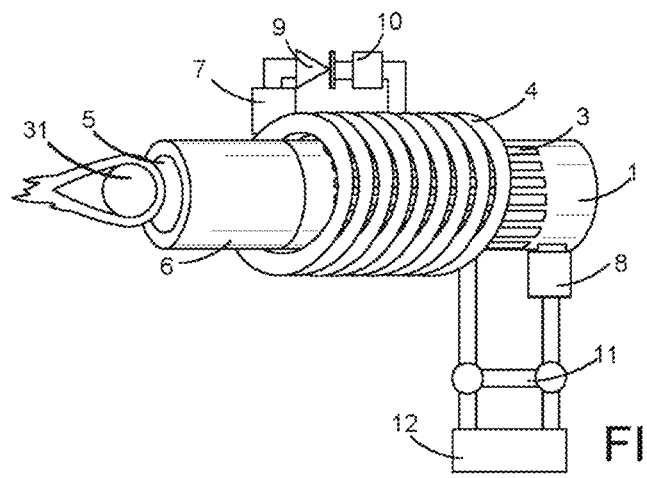
FIG. 10 is a depiction of the first stage of operation of all embodiments.

As shown in FIG. 10, the active functions of the invention begin when the solid propellant 5 is ignited by an ignition component 31. The invention then uses the chemical energy from the burning solid propellant 5 to produce thrust. This thrust is directed by the appropriate aerodynamic structures 6, such as a finned cap surrounding the propellant, so that a majority of the thrust produced will cause a centripetal acceleration of the magnet-encircled explosively laden dynamo armature core 3. That core then rotates inside a stationary solenoid winding 4.

Figure 11:
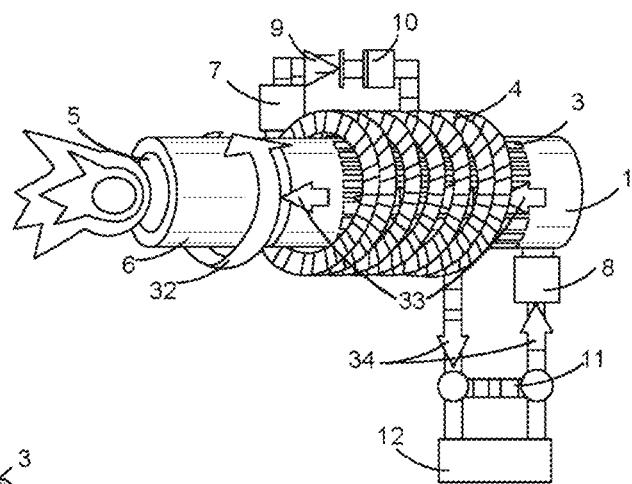
FIG. 11 is a depiction of the second stage of operation of all embodiments.

As that core rotates 32, it induces an electromotive force in the solenoid winding of the HEPFCP 33, causing the invention to act much as a stator in dynamo, as per FIG. 11. This induced AC voltage is then rectified into a DC current by the rectifier 9, which then charges a capacitor bank 10. The current is indicated by the striping added to the solenoid winding and electrical components, with direction indicated by arrows 34.

Figure 12:
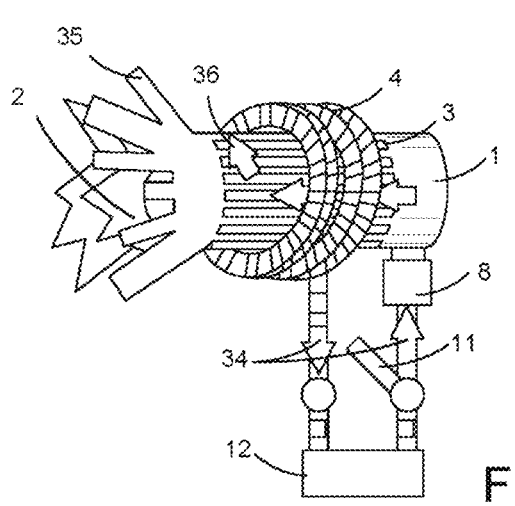
FIG. 12 is a depiction of the third stage of operation of all embodiments.

Eventually the propellant 5 will burn down to the explosive core. At that point, as shown in FIG. 12, the explosive in the core 2 will ignite and begin to expand 35. The expansion will cause the magnets 3 attached to the outside of the armature 1 of the core to contact the surrounding solenoid winding 4, forming a new circuit. The compression caused by the continuously expanding core 35 will diminish the number of turns not short circuited, compressing the magnetic field, and creating an inductive current 36. At the point of greatest flux compression, a load switch 11 is opened, and the maximum current is delivered to the load 12.

The second embodiment uses electromagnets instead of permanent magnets.

The second embodiment is similar to the first embodiment, with the exception that electromagnets are used instead of permanent magnets, requiring at a minimum a batter to initially power the electromagnet. Additionally, wiring to power the field-coil on the magnet would be needed. The rectified current would then be used to power the field-coil.

The basic components of the second embodiment are shown in FIG. 13, FIG. 14, FIG. 15, FIG. 16, FIG. 17, FIG. 18, FIG. 19, and FIG. 20. The functioning of the embodiment is shown in the diagram that is FIG. 21. There is a rotating core as shown in FIG. 13 with an armature 1 containing an explosive 2. This core is encircled by vertical electromagnets 19 as shown in FIG. 14. A solenoid winding 4 covers the magnet-encircled armature in coils extending the entire length of the electromagnet-encircled armature. The cross-section in FIG. 15 shows the solenoid winding 4 encircling the electromagnets 19, which are attached to the armature 1, which houses the explosive 2. FIG. 16 shows how one end of the armature is a solid flammable accelerant 5 contained by an aerodynamic structure capable of directing the thrust of the accelerant as the accelerant burns 6, such as a thrust-producing finned cap. FIG. 17 shows a cross-section of that end of the armature, showing the solenoid winding 4 surrounding the electromagnets 19, and instead of showing the explosive core inside the armature, shows the accelerant 5 contained inside the cap 6.

Figure 18:
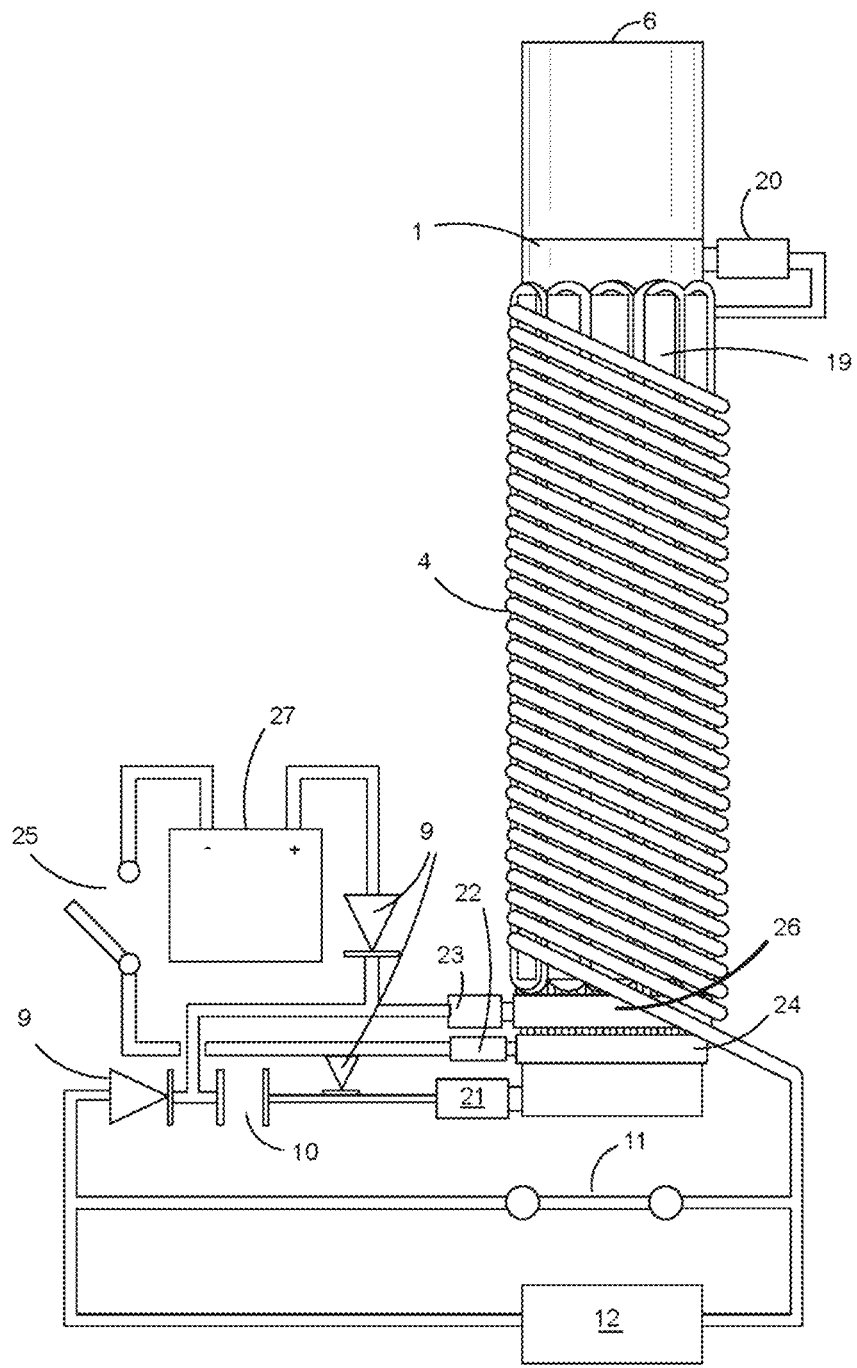
FIG. 18 is a view of the layout of the second embodiment.

FIG. 18 depicts the overall layout of the second embodiment. Brushes 20, 21, 22, 23 are attached to each end of the core 1.

The first brush 20 is also attached to the solenoid winding.

The second brush 21 is also attached to the solenoid winding and is attached to the core by electronics consisting at a minimum of a rectifier 9 (such as diodes, thyristor or semiconductor-controlled rectifier) to change AC voltage to a DC current, a capacitor bank 10, a load switch 11, and a load to which the current will be delivered 12.

The third brush 22 is attached to a contact ring 24 encircling the core and to electronics consisting at a minimum of a terminus of a switch 25 to turn on the electromagnets and a rectifier 9 (such as diodes, thyristor or semiconductor-controlled rectifier) connecting to the electronics of the second brush.

The fourth brush 23 is attached to a second contact ring 26 encircling the core, to the electronics attached to the second brush 21, and to electronics consisting at a minimum of a rectifier 9 (such as diodes, thyristor or semiconductor-controlled rectifier), a battery 27, and a switch 25 to turn on the electromagnets 19.

Figure 19:
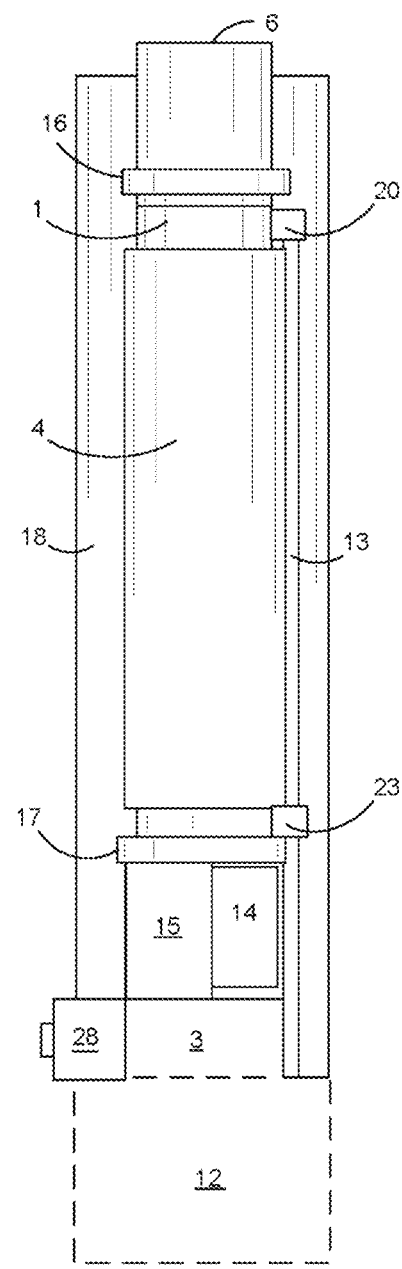
FIG. 19 is a cross-sectional view of the outer housing and some inner components of the second embodiment.

As shown in FIG. 19, the brushes are connected by necessary structures and wiring for the functioning of the brushes 20, 21, and the electronics 14 are in a housing 15 at the bottom end of the core.

As also shown in FIG. 18, on one end of the armature, a bearing 16 connects the accelerant and its containment structure 6 to the armature core 1. On the other end of the armature is another bearing 17 that connects the armature to the electronic components of the invention 14, in their housing 15. A switch button 28 connected to the electronics of the third brush and the fourth brush and that activates the electromagnets is connected to the battery 27 below the electronics housing 15. All components are then encased in a non-conductive housing 18, with the load 12 at the end next to the electronics housing 15 and battery 27.

Figure 20:
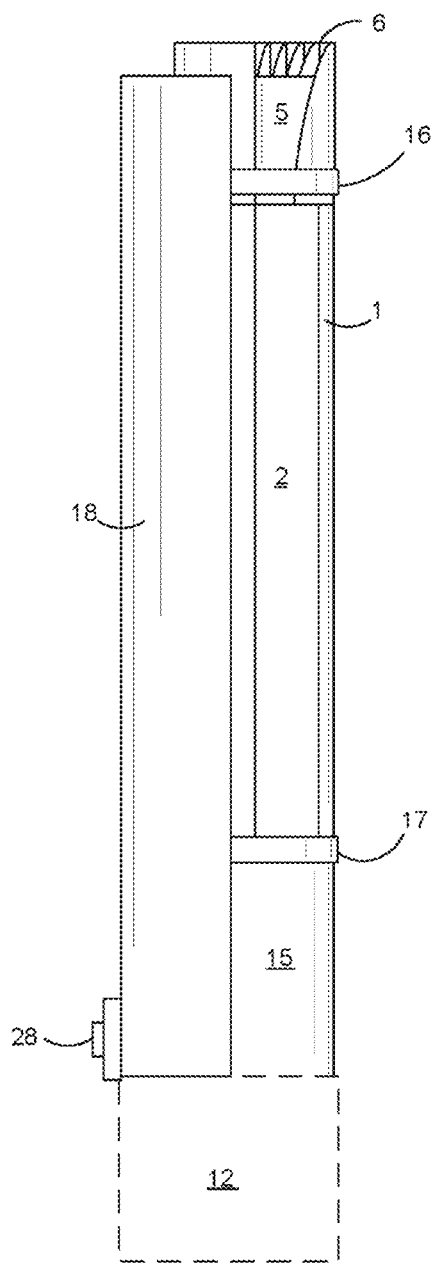
FIG. 20 is a cross-sectional view of the outer housing and additional inner components of the second embodiment.
Figure 21:
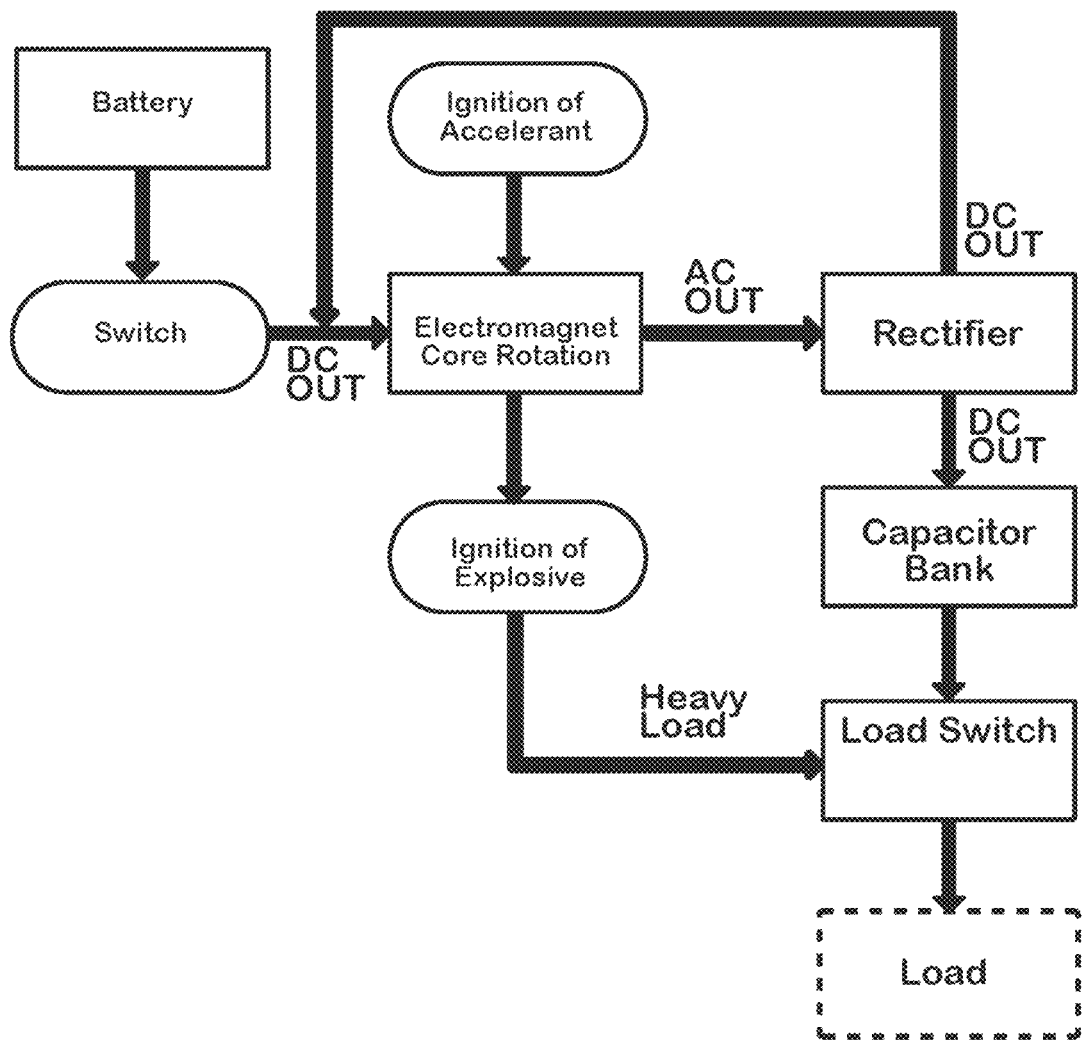
FIG. 21 is a diagram of the operation of the second embodiment.

FIG. 20 depicts another view of the second embodiment showing how the non-conductive housings 15, 18 cover the inner components, how the finned cap 6 covers the accelerant 5, and where the switch button 28 is located.

The active functions of the invention begin when the electromagnets are turned on using the switch button 28 and the solid propellant 5 is ignited. The invention then uses the chemical energy from the burning solid propellant 5 to produce thrust. This thrust is directed by the appropriate aerodynamic structures 6, such as a finned cap surrounding the propellant, so that a majority of the thrust produced will cause a centripetal acceleration of the magnet-encircled explosively laden dynamo armature core 3. That core then rotates inside a stationary solenoid winding 4.

As that core rotates 32, it induces an electromotive force in the solenoid winding of the HEPFCP 33, causing the invention to act much as a stator in dynamo. This induced AC voltage is then rectified into a DC current by the rectifier 9, which then charges a capacitor bank 10. The current is indicated by the striping added to the solenoid winding and electrical components, with direction indicated by arrows 34.

Eventually the propellant 5 will burn down to the explosive core. At that point, the explosive in the core 2 will ignite and begin to expand 35. The expansion will cause the electromagnets 19 attached to the outside of the armature 1 of the core to contact the surrounding solenoid winding 4, forming a new circuit. The compression caused by the continuously expanding core 35 will diminish the number of turns not short circuited, compressing the magnetic field, and creating an inductive current 36. At the point of greatest flux compression, a load switch 11 is opened, and the maximum current is delivered to the load 12.

These processes are similar to those depicted in FIG. 10, FIG. 11, and FIG. 12, only using electromagnets instead of magnets.

The third embodiment uses electromagnets as in the second embodiment but uses a looped voltage multiplier in place of the rectifier and capacitor setup.

Interestingly enough, the electromagnetic version also provides for an opportunity to include a looped voltage multiplier in place of the rectifier and capacitor setup. Allowing the field-coil to gain in strength during the charging phase of the propellant ignition. Depending on the current generated by the looped voltage multiplier a voltage regulator might needed, but with the short life of the generator this could probably be left out or designed around.

The third embodiment is similar to the second embodiment, with the exception that a looped voltage multiplier is used instead of the rectifier and capacitor.

The basic components of the third embodiment are shown in FIG. 13, FIG. 14, FIG. 15, FIG. 17, FIG. 22, FIG. 23, and FIG. 24. The functioning of the embodiment is shown in the diagram that is FIG. 25. There is a rotating core as shown in FIG. 13 with an armature 1 containing an explosive 2. This core is encircled by vertical electromagnets 19 as shown in FIG. 14. A solenoid winding 4 covers the magnet-encircled armature in coils extending the entire length of the electromagnet-encircled armature. As FIG. 14 shows a cutaway of the solenoid winding to better show the electromagnets, the cross-section in FIG. 15 depicts how the solenoid winding covers the entire core.

Figure 22:
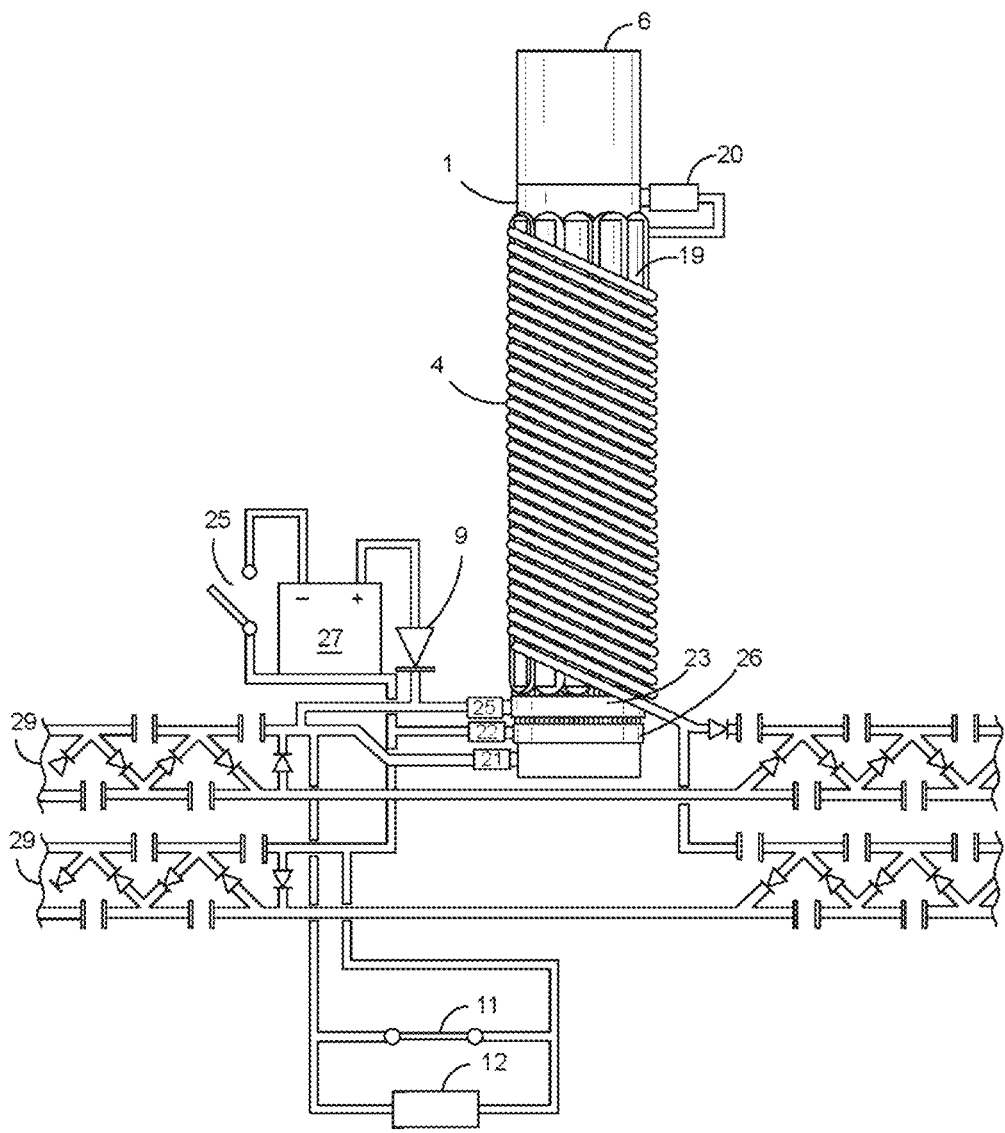
FIG. 22 is a view of the layout of the third embodiment.

FIG. 22 depicts the overall layout of the third embodiment. Brushes 20, 21, are attached to each end of the core 1.

The first brush 20 is also attached to the solenoid winding 4.

The second brush 21 is attached to the core by electronics consisting of a load switch 11, a load to which the current will be delivered 12, and a looped voltage multiplier 29 that is in turn connected to the solenoid winding 4.

The third brush 22 is attached to a contact ring 24 encircling the core; to electronics consisting at a minimum of a switch 25 to turn on the electromagnets 19, a battery 27, a rectifier 9 (such as diodes, thyristor or semiconductor-controlled rectifier), and looped voltage multiplier 29 that is in turn connected to the solenoid winding 4.

The fourth brush 25 is attached to a second contact ring 26 encircling the core and to a looped voltage multiplier 29 attached to the second brush 21, and to electronics consisting at a minimum of a rectifier 9 (such as diodes, thyristor or semiconductor-controlled rectifier), a battery 27, and a switch 24 to turn on the electromagnets 19.

The electronics of the brushes are interconnected through the looped voltage multiplier 29; the load switch 11 and load 12 elements; and the switch 25, battery 27, and rectifier 9 elements, as depicted in FIG. 22.

Figure 23:
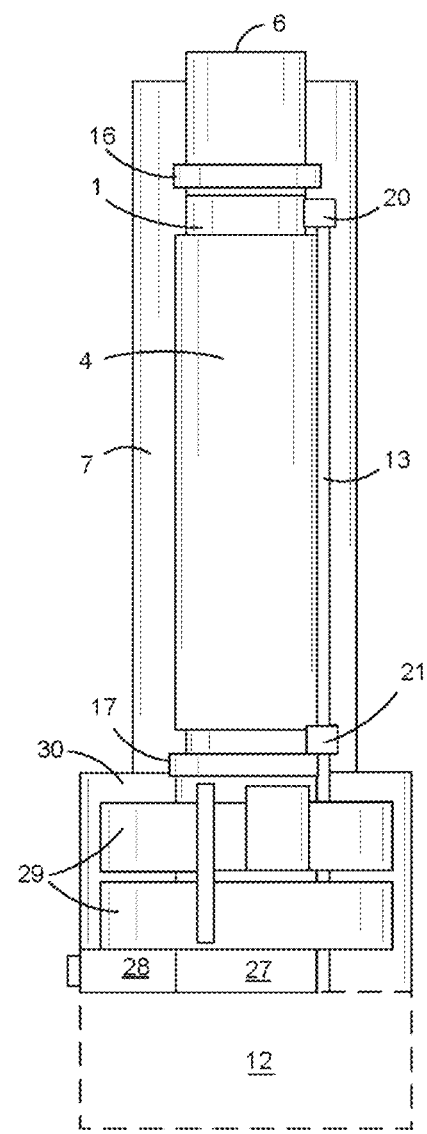
FIG. 23 is a cross-sectional view of the outer housing and some inner components of the third embodiment.

As shown in FIG. 23, the brushes are connected by necessary structures and wiring for the functioning of the brushes 20, 21, and the electronics 13, including the looped voltage multiplier 29, are in a non-conductive insulating housing 30 at one end of the core, along with the battery 27 and switch button 28.

Figure 24:
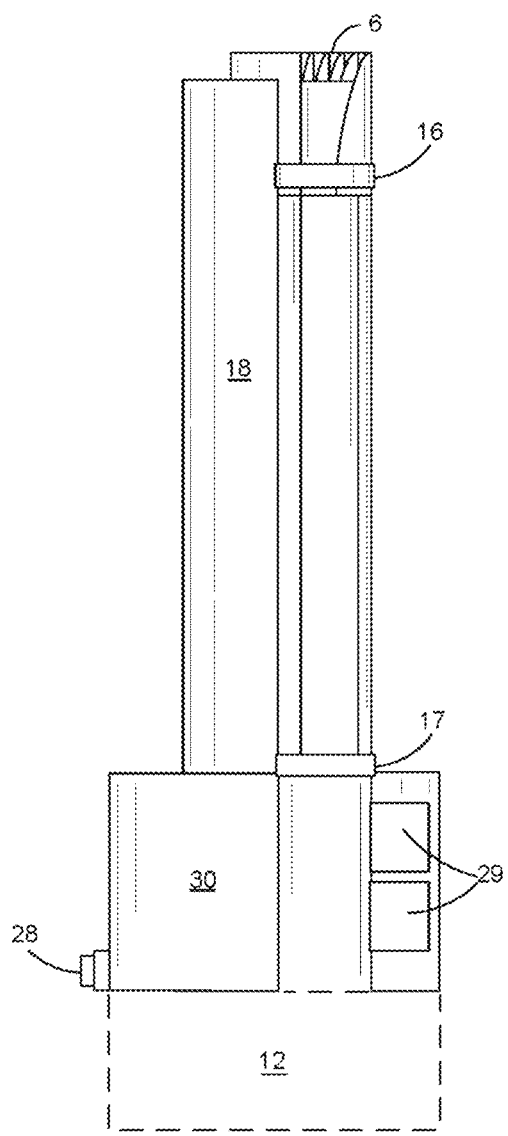
FIG. 24 is a cross-sectional view of the outer housing and additional inner components of the third embodiment.
Figure 25:
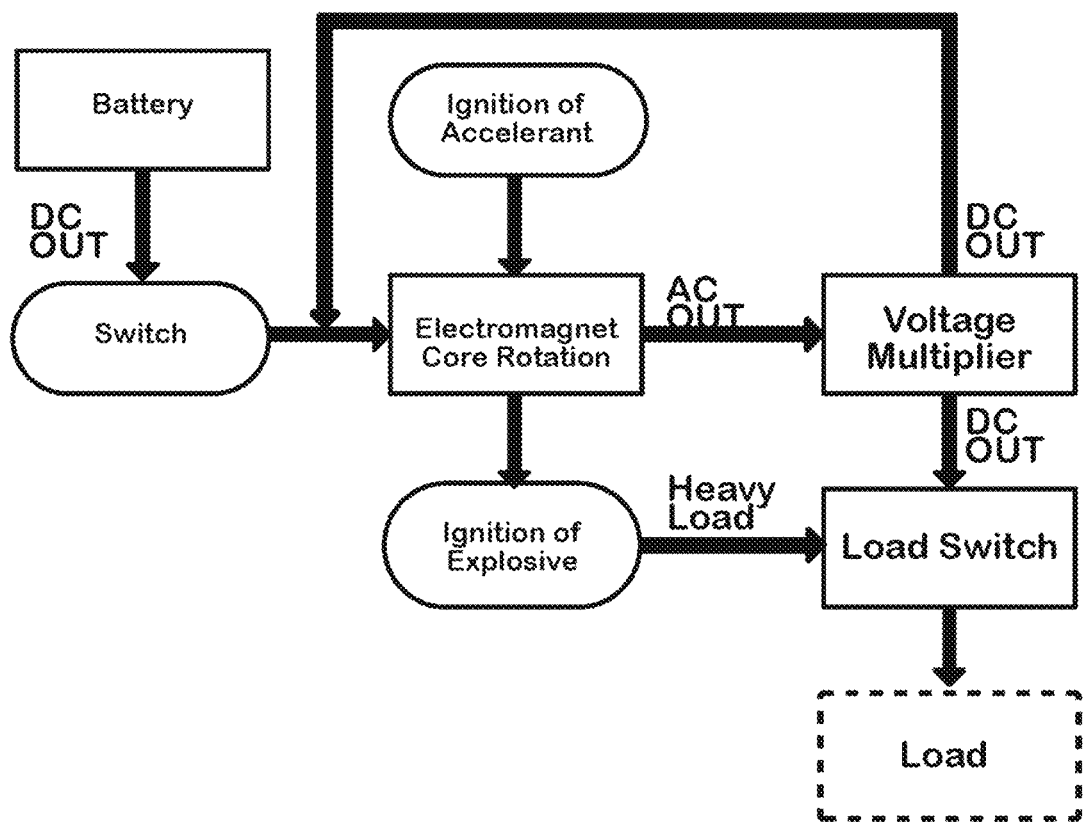
FIG. 25 is a diagram of the operation of the third embodiment.

As also shown in FIG. 24, on one end of the armature, a bearing 16 connects the accelerant and its containment structure 6 to the top of the armature core 1. On the other end of the armature is another bearing 17 that connects the armature to the electronic components of the invention 14, in their housing 15. A switch button 28 connected to the electronics of the third brush 22 and the fourth brush 25 and that activates the electromagnets 19 is connected to the battery 27 below the electronics housing. All components are then encased in a non-conductive housing 30, with the load 12 at the end next to the non-conductive housing 30.

The cross-section in FIG. 15 shows the solenoid winding 4 encircling the electromagnets 19, which are attached to the armature 1, which houses the explosive 2. FIG. 16 shows how one end of the armature is a solid flammable accelerant 5 contained by an aerodynamic structure capable of directing the thrust of the accelerant as the accelerant burns 6, such as a thrust-producing finned cap. FIG. 17 shows a cross-section of that end of the armature, showing the solenoid winding 4 surrounding the electromagnets 19, and instead of showing the explosive core inside the armature, shows the accelerant 5 contained inside the cap 6.

The active functions of the invention begin when the electromagnets are turned on using the switch button 28 and the solid propellant 5 is ignited. The invention then uses the chemical energy from the burning solid propellant to produce thrust. This thrust is directed by the appropriate aerodynamic structures 6, such as a finned cap surrounding the propellant, so that a majority of the thrust produced will cause a centripetal acceleration of the magnet-encircled explosively laden dynamo armature core. That core then rotates inside a stationary solenoid winding 4.

As that core rotates, it induces an electromotive force in the solenoid winding of the HEPFCP, causing the invention to act much as a stator in dynamo. This induced AC voltage is then rectified into a DC current by the rectifier 9, which then charges a capacitor bank 10.

Eventually the propellant will burn down to the explosive core. At that point, the explosive in the core 2 will ignite and begin to expand. The expansion will cause the electromagnets 20 attached to the outside of the armature 1 of the core to contact the surrounding solenoid winding 4, forming a new circuit. The compression caused by the continuously expanding core will diminish the number of turns not short circuited, compressing the magnetic field, and creating an inductive current. At the point of greatest flux compression, a load switch 11 is opened, and the maximum current is delivered to the load 12.

These processes are similar to those depicted in FIG. 10, FIG. 11, and FIG. 12, only using electromagnets instead of magnets and a voltage multiplier instead of the rectifier and capacitor.

Although the invention has been shown and described with respect to a certain preferred embodiment or embodiments, it is understood that equivalent alterations and modifications will occur to others skilled in the art upon the reading and understanding of this specification and the annexed drawings. In particular regard to the various functions performed by the above-described elements (components, assemblies, stores, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in embodiments of the invention described above.

In addition, while a particular feature of the invention may have been described above with respect to only one or more of several illustrated embodiments, such feature may be combined with one or more other features of the other embodiments, as may be desired and advantageous for any given or particular application. The accompanying claims are intended to cover such modifications as would fall within the true scope and spirit of the present invention.

The embodiments disclosed herein are therefore to be considered in all respects as illustrative and not restrictive, the scope of the invention being indicated by the appended claims, rather than the foregoing description, and all changes which come within the meaning and range of equivalency of the claims are therefore intended to be embraced therein.

The invention claimed is:

1. A helical-type explosively pumped flux compression generator (HEPFCP) capable of natively generating its own electrical current in an amount required to successfully power the explosive phase of current generation required to power a load comprising:
   a. a solid propellant,
   b. an aerodynamic structure capable of directing the thrust from burning said propellant,
   c. an explosively laden dynamo armature core formed by permanent magnets attached to the outside of the armature,
   d. a stationary solenoid winding,
   e. a rectifier,
   f. a capacitor bank, and
   g. a load, wherein through said appropriate aerodynamic structure directs said thrust from said burning propellant such that a majority of the thrust produced will cause a centripetal acceleration of said core, rotating said explosively laden dynamo armature inside said stationary solenoid winding, and wherein the rotation of said core induces an electromotive force in said solenoid winding of said HEPFCP, causing it to act much as a stator in dynamo, and wherein said induced AC voltage is rectified into a DC current by said rectifier that then charges said capacitor bank, and wherein when said propellant burns down to said explosive core, said core will begin to expand, contacting the surrounding said solenoid winding, forming a new circuit, and the compression caused by the continuously expanding core will diminish the number of turns not short circuited, compressing the magnetic field, and creating an inductive current, and at the point of greatest flux compression, a load switch is opened, and the maximum current is delivered to said load.

2. A helical-type explosively pumped flux compression generator (HEPFCP) capable of natively generating its own electrical current in an amount required to successfully power the explosive phase of current generation required to power a load comprising:
   a. a solid propellant,
   b. an aerodynamic structure capable of directing the thrust from burning said propellant, c. an explosively laden dynamo armature core formed by field-coil electromagnets magnets attached to the outside of the armature,
d. a stationary solenoid winding,
e. a rectifier,
f. a capacitor bank, and
g. a load, wherein through said appropriate aerodynamic structure directs said thrust from said burning propellant such that a majority of the thrust produced will cause a centripetal acceleration of said core, rotating said explosively laden dynamo armature inside said stationary solenoid winding, and wherein the rotation of said core induces an electromotive force in said solenoid winding of said HEPFCP, causing it to act much as a stator in dynamo, and wherein said induced AC voltage is rectified into a DC current by said rectifier that then charges said capacitor bank, and wherein when said propellant burns down to said explosive core, said core will begin to expand, contacting the surrounding said solenoid winding, forming a new circuit, and the compression caused by the continuously expanding core will diminish the number of turns not short circuited, compressing the magnetic field, and creating an inductive current, and at the point of greatest flux compression, a load switch is opened, and the maximum current is delivered to said load.

3. A helical-type explosively pumped flux compression generator (HEPFCP) capable of natively generating its own electrical current in an amount required to successfully power the explosive phase of current generation required to power a load comprising:
a. a solid propellant,
b. an aerodynamic structure capable of directing the thrust from burning said propellant,
c. an explosively laden dynamo armature core formed by field-coil electromagnets magnets attached to the outside of the armature,
d. a stationary solenoid winding,
e. a looped voltage multiplier, and
f. a load, wherein through said appropriate aerodynamic structure directs said thrust from said burning propellant such that a majority of the thrust produced will cause a centripetal acceleration of said core, rotating said explosively laden dynamo armature inside said stationary solenoid winding, and wherein the rotation of said core induces an electromotive force in said solenoid winding of said HEPFCP, causing it to act much as a stator in dynamo, and wherein instead of using a traditional capacitor bank and rectifier set up, said looped voltage multiplier is constructed using the same components (capacitors and diodes) found in a rectifier assembly, with a series of capacitors and diodes arranged so that the cycling negative and positive peaks of an alternating current cause a potential difference between each capacitor in the series, the potential difference cascading down the circuit, generating a higher DC voltage than the initial AC voltage feeding the circuit, while the short life of the device allows a unique set up where the voltage multiplier loops back unto itself causing a continuous feed-back loop that also feeds current to the electromagnet powering the generator itself, further causing more feedback, allowing a quicker time to generate the necessary magnetic field for proper functionality, such that the loop-back setup of the looped voltage multiplier allows the looped voltage multiplier to act as both rectifier and capacitor bank, and wherein when said propellant burns down to said explosive core, said core will begin to expand, contacting the surrounding said solenoid winding, forming a new circuit, and the compression caused by the continuously expanding core will diminish the number of turns not short circuited, compressing the magnetic field, and creating an inductive current, and at the point of greatest flux compression, a load switch is opened, and the maximum current is delivered to said load.

* * * * *